United States Patent [19]

Mo

[11] Patent Number: 5,512,850
[45] Date of Patent: Apr. 30, 1996

[54] SWITCHED HIGH-SLEW RATE BUFFER

[75] Inventor: Zhong H. Mo, Daly City, Calif.

[73] Assignee: TelCom Semiconductor, Inc., Mountain View, Calif.

[21] Appl. No.: 316,161

[22] Filed: Sep. 30, 1994

[51] Int. Cl.$^6$ ...................................................... H03B 1/00
[52] U.S. Cl. ............................................ 327/108; 327/382
[58] Field of Search .................................. 326/17, 18, 19, 326/29; 327/65, 108–111, 165, 167, 170, 184, 362, 374, 376, 377, 561, 563, 91, 95, 382, 551

[56] References Cited

U.S. PATENT DOCUMENTS 4,410,855  10/1983  Underhill et al. ..................... 327/376

Primary Examiner—Timothy P. Callahan
Assistant Examiner—Jeffrey Zweizig
Attorney, Agent, or Firm—Skjerven, Morrill, MacPherson, Franklin & Friel; David E. Steuber

[57] ABSTRACT

A buffer circuit having both high gain and high slew rate is implemented using a high gain-low slew rate amplifier and a switch network. The buffer circuit's operation is divided into three periods. During the first period, the output of the amplifier is isolated from the load to allow the amplifier's output voltage to more quickly reaches its final voltage level. During the second period, the switch network couples the amplifier output lead to the load input lead where the amplifier drives the voltage at the load's input lead to a voltage substantially equal to the voltage of the input signal. During the third period, the switch network isolates the amplifier from the load and couples the load's input lead to a source of ground potential to quickly slew the load's input lead to ground potential.

14 Claims, 3 Drawing Sheets

SWITCHED HIGH-SLEW RATE BUFFER

FIELD OF THE INVENTION

This invention relates to buffer circuits, and particularly to slew rate buffer circuits having switch networks to increase slew rate.

BACKGROUND INFORMATION

Generally, for an operational amplifier circuit implemented in a given technology, the product of the amplifier's gain and maximum bandwidth is constant. Consequently, the design of an operational amplifier circuit typically involves compromising between high gain and high bandwidth. Thus, a designer must decide which parameter is more important for a particular application and design the operational amplifier circuit accordingly (i.e., the designer "trades off" gain for bandwidth, or vice versa).

Further, the slew rate (i.e., the rate at which the output voltage changes) of an operational amplifier circuit, in general, increases as bandwidth increases. Because an amplifier's slew rate increases with the amplifier's bandwidth, the designer also trades off gain for slew rate (or vice versa).

FIG. 1 (Prior Art) shows a schematic diagram of a typical unity gain buffer circuit. Buffer circuit 100 includes operational amplifier 101 and drives a load 120. Load 120 is both resistive and capacitive, and represents the loading "seen" by buffer circuit 100 when driving the input of another circuit.

The output of buffer circuit 100 is determined by the equation:

$$Vout = Vin/(1+1/A)$$

where A is the open loop gain of amplifier 101. For a unity gain buffer circuit, gain A must be sufficiently high so that voltage Vout is substantially equal to voltage Vin. However, as described above, the designer must trade off slew rate for gain. Thus, if the designer chooses to design buffer circuit with a high gain amplifier to more closely achieve unity gain, the buffer circuit's slew rate is decreased. A low slew rate may introduce error into the buffer circuit's output signal (described below in conjunction with FIG. 2). Thus, in applications requiring both unity gain and high slew rate from the same buffer, buffer circuit 100 is inadequate. One such application is an integrator circuit (discussed below in conjunction with FIG. 4).

FIG. 2 shows the output waveform of the buffer circuit 100 (FIG. 1) to a step input signal. Buffer circuit 100, in response to a step input signal having a voltage of $v_1$ represented by Vin waveform 200, generates at LOADOUT node 110 (FIG. 1) an output signal represented by LOADOUT waveform 210. Ideally, LOADOUT waveform 210 is identical to Vin waveform 200. However, because buffer circuit 100 has a finite slew rate and because of the loading due to load 120, buffer circuit 100 requires time t1 to drive the voltage at LOADOUT node 110 from ground potential to voltage $v_1$. Similarly, buffer circuit 100 requires time t2 to drive LOADOUT node 110 from voltage $v_1$ to ground potential. Shaded areas A1 and A2 represent deviation by buffer circuit 100 from the ideal performance. Thus, as the slew rate of buffer circuit 100 decreases, areas A1 and A2 increase.

For some applications (such as an integrator circuit, which measures the total area under waveform 210) area A1 lost during the ramp up is offset by area A2 gained during the ramp down. However in general the positive going slew rate is different from the negative going slew rate and thus A1 and A2 have an area mismatch. In practice, it is very difficult to match the positive and negative going slew rates.

SUMMARY

In accordance with the present invention, a buffer circuit using an operational amplifier circuit having both high gain and high slew rate is implemented using a high gain-low slew rate amplifier and a switch network.

The buffer circuit's operation is divided into three periods. The first period starts when an input signal is applied to the input lead of the buffer circuit. During the first period, the output of the amplifier is isolated from the load, which is advantageous in applications where the load is sensitive to the magnitude and duration of a signal present at the load's input lead.

The second period begins when the output of the amplifier reaches its final value. The switch network couples the amplifier output lead to the load input lead. Because the voltage at the output lead of the amplifier has already reached its final value, the voltage at the load's input lead is quickly driven to a voltage substantially equal to the voltage of the input signal. In some applications (e.g., an integrator circuit), the pertinent slew rate is determined from the time the buffer output is coupled to the load and, thus, a higher slew rate is achieved in these applications when compared to a traditional buffer circuit without a switch network.

The third period begins when the input signal's voltage is substantially equal to ground potential. During the third period, the switch network isolates the amplifier from the load and couples the load's input lead to a source of ground potential. Thus, the voltage at the load's input lead more quickly slews to ground potential.

DETAILED DESCRIPTION

Figure 3:
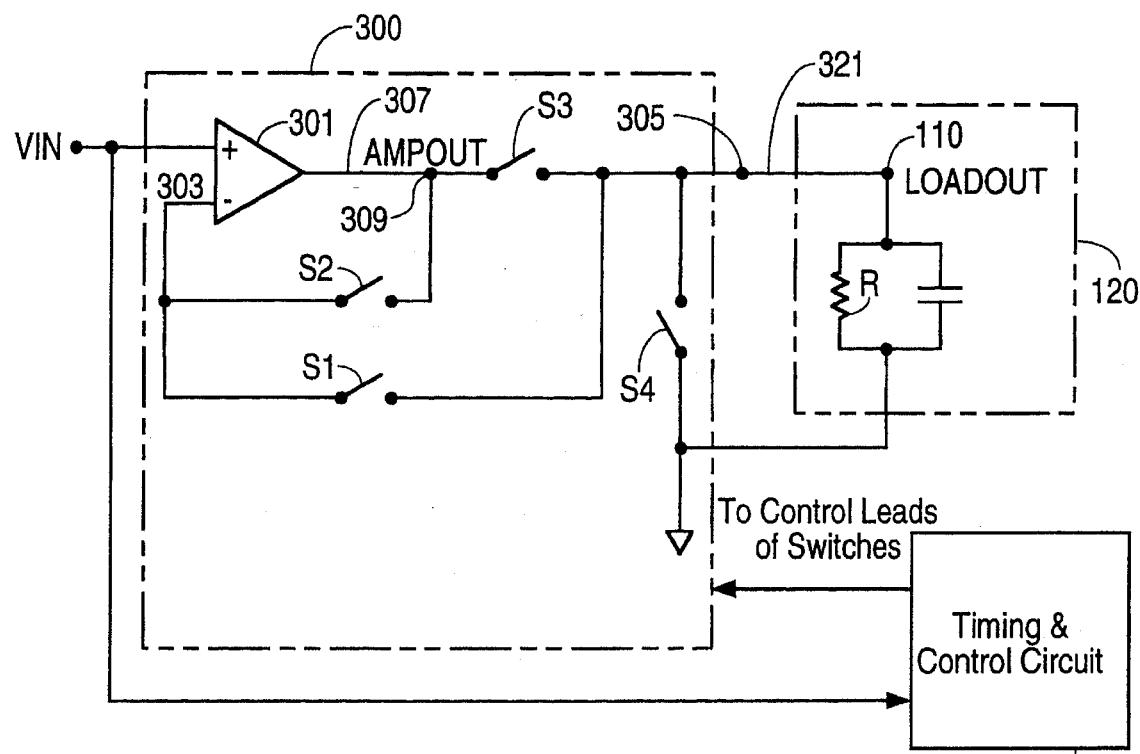
FIG. 3 shows a schematic diagram of a buffer circuit according to one embodiment of the present invention.

FIG. 3 shows a schematic diagram of the implementation of a buffer circuit in accordance with one embodiment of the present invention. Buffer circuit 300 is composed of the high gain, low slew rate amplifier 301 and switches S1–S4. Amplifier 301 can be of the same design as amplifier 101 shown in FIG. 1. Switch S1 couples a negative input 303 of amplifier 301 to an output terminal 305 of buffer circuit 300. Switch S2 couples an output lead 307 of amplifier 301 to input lead 303 via an AMPOUT node 309. Switch S3 couples amplifier output lead 307 to buffer circuit output terminal 305 via AMPOUT node 309. Switch S4 couples buffer circuit output terminal 305 to a source of ground potential. In one embodiment, switches S1–S4 are implemented using field effect transistors. Switches S1–S4 are controlled to open or close by a timing and control circuit 340.

Figure 4:
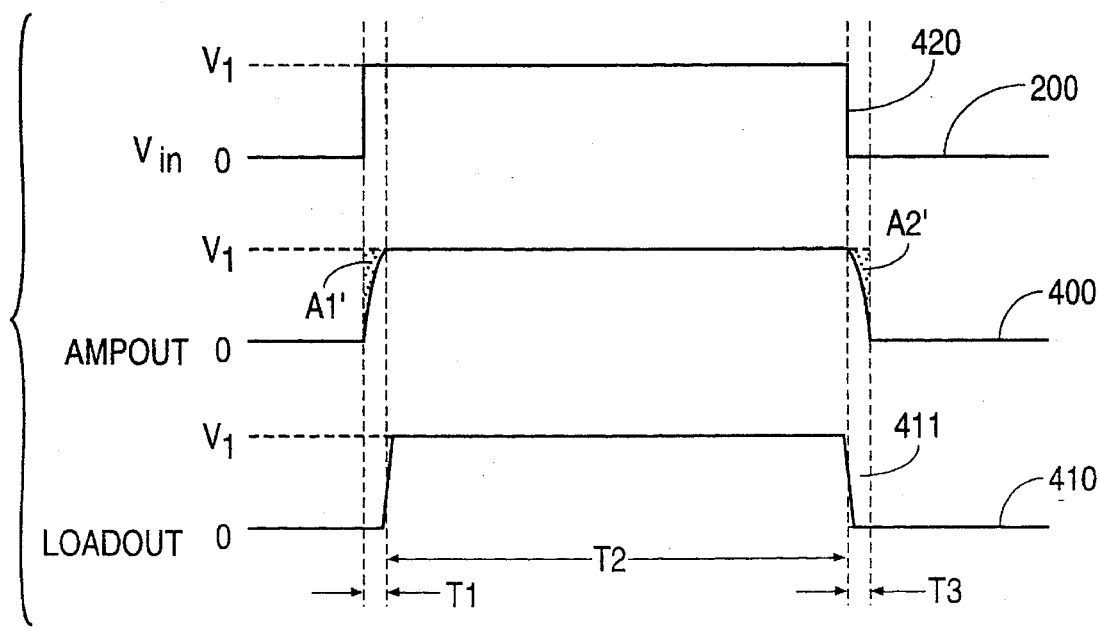
FIG. 4 shows the output waveform of the buffer circuit of FIG. 3 in response to a step input signal.

FIG. 4 shows the output waveforms of the buffer circuit of FIG. 3 in response to a step input signal. At the beginning of a first time period T1, timing and control circuit 340 controls switches S1 and S3 of buffer circuit 300 to be opened and switches S2 and S4 to be closed. In this embodiment switch S4 is closed during time period T1 so that the input voltage to load 120 is approximately 0 V. However, switch S4 may be left open depending on the requirements of load 120. Input signal Vin received at the positive input lead of amplifier 301 is allowed to change. Time period T1 is predetermined to allow sufficient time for the voltage at AMPOUT node 309 to reach its final value.

Because switches S1 and S3 are opened, amplifier 301 is isolated from load 120. Consequently, buffer circuit 300 does not influence load 120 during time period T1, which is advantageous in applications where load 120 is sensitive to the magnitude and duration of the buffer circuit's output signal (e.g., an integrator circuit, which generates an output signal having a voltage that represents the integral of the signal output by the buffer circuit).

At the end of time period T1, the output signal of amplifier 301 has slewed to its final value (i.e., a voltage substantially equal to the voltage of input signal Vin) and time period T2 begins. Timing and control circuit 340 controls switches S1 and S3 to be closed and switches S2 and S4 to be opened. As a result, negative input lead 303 of amplifier 301 is now coupled to output terminal 305 of buffer circuit 300 via switch S1. AMPOUT node 309 is coupled to an input lead 321 of load 120 via switch S3. Thus, the voltage on LOADOUT node 110 quickly slews to a voltage substantially equal to the voltage of input signal Vin. The slew rate of buffer circuit 300 during period T2 only depends on the impedance of load 120 and the maximum output current of amplifier 301. The maximum output current of amplifier 301 can be easily changed without affecting its gain. Thus, the designer can design amplifier 301 to have a current output that drives load 120 at an appropriately fast slew rate.

Figure 1:
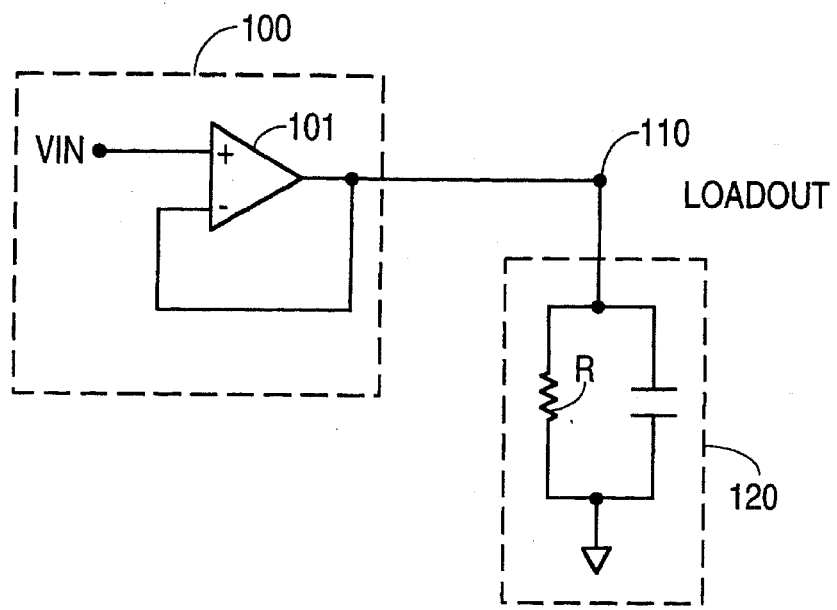
FIG. 1 (Prior Art) shows a schematic diagram of a typical unity gain buffer circuit.

Time period T3 begins when the voltage level of input signal Vin returns to ground. In this application, because the duration of step input signal Vin is predetermined, just prior to the beginning of the time period T3, timing and control circuit 340 controls switches S1 and S3 to be opened and switches S2 and S4 to be closed. As a result, output terminal 305 of buffer circuit 300 is isolated from input lead 321 of load 120, and input lead 321 of load 120 is connected to a source of ground potential. Switch S4 is designed to have a low resistance when closed to allow the voltage at load input lead 321 to more quickly slew to ground potential than buffer circuit 100 (FIG. 1). Thus, when compared to time T2 (FIG. 2), the time needed to pull the voltage at load input lead 321 to ground potential is negligible.

As a result, a substantially constant voltage $v_1$ supplied by buffer circuit 300 has been coupled to the load for a time substantially equal to time period T2. Thus, when buffer circuit 300 is used to drive an integrator circuit, the integrating circuit integrates the signal output by buffer circuit 300 over the time period T2.

Figure 2:
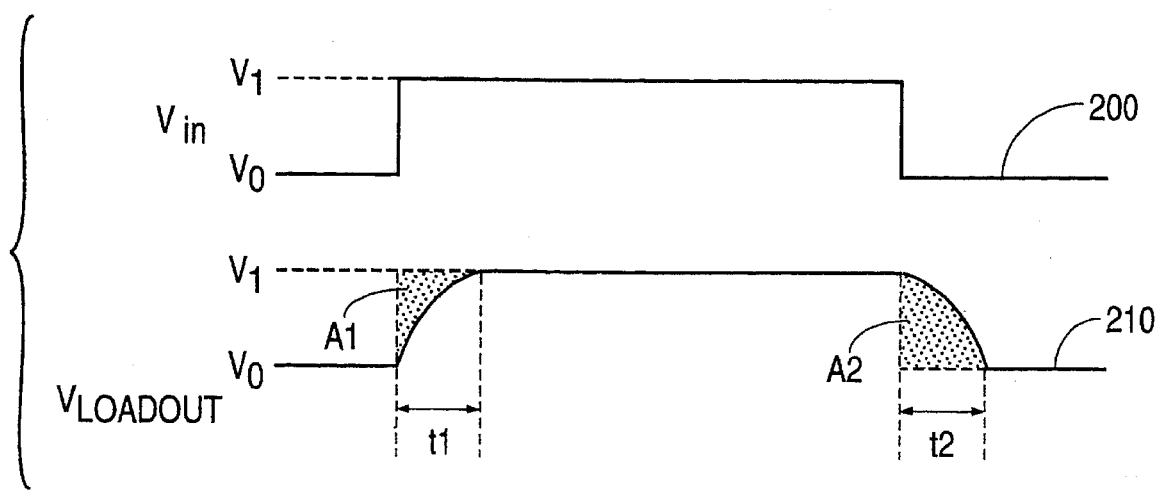
FIG. 2 shows the output waveform of the buffer circuit of FIG. 1 in response to a step input signal.

AMPOUT waveform 400 shows areas A1' and A2', which are the counterparts of A1 and A2 from waveform 210 (FIG. 2). However, areas A1' and A2' may be smaller than areas A1 and A2 because load 120 is disconnected from AMPOUT node 309.

LOADOUT waveform 410 represents the input signal received by load 120 because at the beginning of time period T2, switch S3 closes to couple node 309 to load input lead 321 and opens when the input signal drops to 0 V. Compared to area A2 (FIG. 2), relatively no error is introduced by buffer circuit 300 when waveform 400 ramps down because the difference in time between falling edge 411 of waveform 410 and falling edge 420 of Vin waveform 200 is negligible. Consequently, buffer circuit 300 typically introduces less error than buffer circuit 100 (FIG. 1) in applications that measure the area under the LOADOUT waveform. For example, contemporaneously filed application Ser. No. [Attorney Docket No. M-2977] "METHOD AND APPARATUS FOR MEASURING CAPACITANCE" by Amado Caliboso discloses that the duration that a step input signal is applied to the input terminal of an integrator circuit is measured to determine the value of an unknown capacitance. Buffer circuit 300 can advantageously be used to provide this step signal to the integrator circuit. The desired step signal is provided by buffer circuit 300 by applying voltage $v_1$ to the input lead of buffer circuit 300 at a time T1 before the desired time for the rising edge of the step signal and grounding the input lead of buffer circuit 300 at the desired time for the falling edge of the step signal. As a result, time period T2 will be the duration of the step input signal applied to integrator circuit input terminal.

Figure 5:
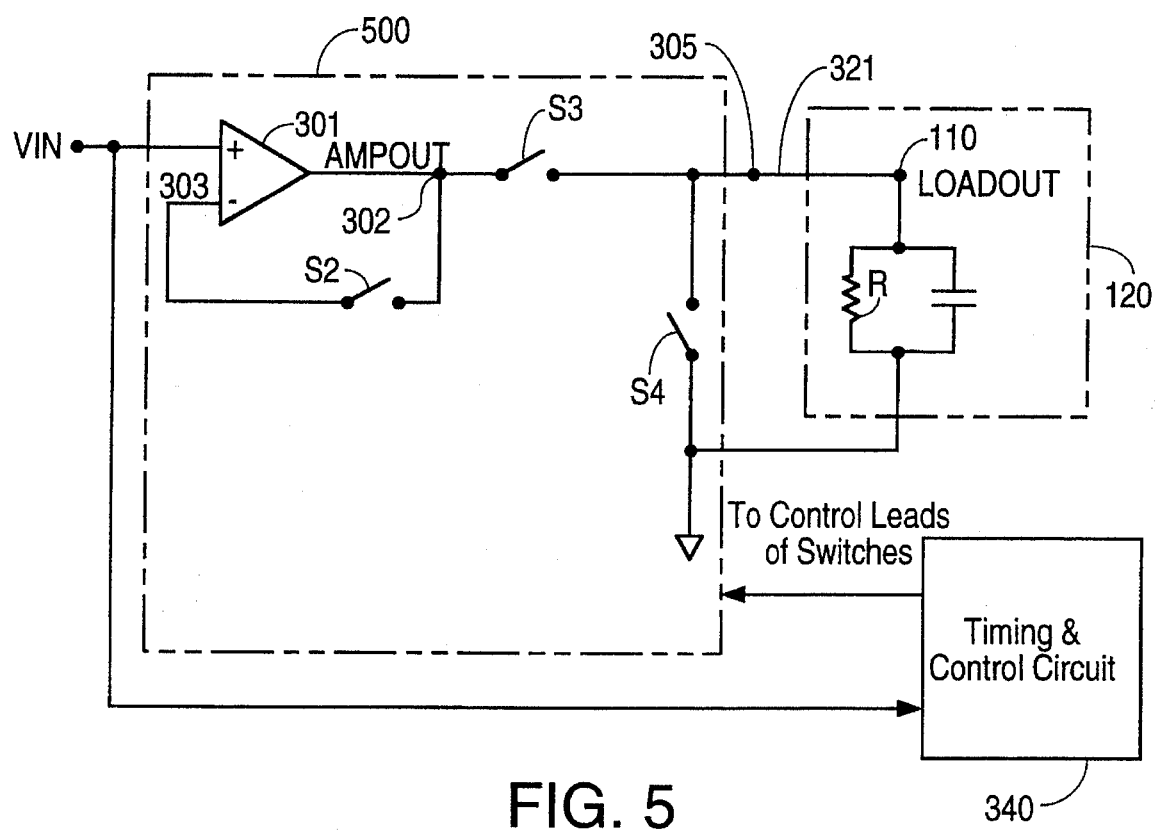
FIG. 5 shows a schematic diagram of a buffer circuit according to another embodiment of the present invention.

FIG. 5 shows a schematic diagram of a buffer circuit according to another embodiment of the present invention. Buffer circuit 500 is similar to buffer circuit 300 (FIG. 3) except that switches S1–S2 are deleted. Like reference numbers are used for like elements between the drawings. Buffer circuit 500 operates in time periods T1–T3 which are the same as for buffer circuit 300.

At the beginning of time period T1, switch S3 is opened and switch S4 is closed. Because switch S3 is opened, buffer circuit 500 is isolated from load 120 and amplifier 301 quickly slews up its output voltage to its final value in a manner similar to that of buffer circuit 300 (FIG. 3).

At the beginning of time period T2, switch S3 closes and switch S4 opens. Just as in buffer circuit 300, the voltage at load input lead 321 quickly slews up because the voltage at AMPOUT node 309 is already at its final value.

During time period T3, switch S3 opens and switch S4 closes. In a manner similar to that of buffer circuit 300, amplifier 301 is isolated from load 120, and the voltage at load input lead 321 is pulled quickly to ground potential through switch S4.

Buffer circuit 500 requires fewer switches than buffer circuit 300 (FIG. 3). However, buffer circuit 500 is less accurate than buffer circuit 300 because switch S3 is not within the negative feedback loop of amplifier 301. In buffer circuit 300, the negative feedback loop operates to keep the voltage the voltage output terminal 305 equal to voltage Vin. In contrast, the negative feedback loop of buffer circuit 500 operates to keep the voltage at AMPOUT node 302 equal to input voltage Vin. Because of the "on" resistance of switch S3 (which may not be constant), there is voltage drop across S3, and consequently, error is introduced.

The foregoing has described the principles and preferred embodiments of the present invention. However, the invention should not be construed as being limited to the particular embodiments described. For example, resistors may be added to the feedback loop of amplifier 301 so that the amplifier's output has gain. Further, switches S1–S4 may be implemented using bipolar transistors or other transistor technology. In applications where the resistance R of load 120 (FIGS. 3 and 5) is relatively small, then switch S4 may not be needed. Thus, the above-described embodiments should be regarded as illustrative rather than restrictive. Variations can be made to those embodiments by workers skilled in the art without departing from the scope of the present invention as defined by the following claims.

I claim:

1. A circuit for driving a load, said circuit having an input terminal and an output terminal, said circuit adapted to receive an input signal at said input terminal, said input signal having a first time period, a second time period, and a third time period, said first, second and third time periods being contiguous, said output terminal adapted to be coupled to said load, said circuit comprising:

an amplifier having a first input lead, a second input lead, and an output lead, said first input lead coupled to said input terminal; and a switch network coupled to said output lead and said output terminal, wherein said switch network isolates said amplifier from said load at the beginning of said first time period, couples said output lead to said load at the beginning of said second time period, and isolates said output lead from said load and couples said output terminal to a source of ground potential at the beginning of said third time period.

2. The circuit recited in claim 1, wherein said switch network comprises a first switch coupled between said output lead and said output terminal, said first switch operative to isolate said amplifier from said load at the beginning of said first and third time periods and operative to couple said amplifier to said load at the beginning of said second time period.

3. The circuit recited in claim 2, wherein said switch network further comprises a second switch coupled between said output terminal and said source of ground potential, said second switch operative to couple said output terminal to said source of ground potential during said third time period.

4. The circuit recited in claim 3, wherein said switch network is further coupled to said second input lead, said output lead, and said output terminal.

5. The circuit recited in claim 4, wherein said switch network further comprises a third switch, said third switch coupled between said output lead and said second input lead of said amplifier, said third switch operative to couple said output lead to said input lead at the beginning of said first and third time periods, and operative to be nonconductive at the beginning of said second time period.

6. The circuit recited in claim 4, wherein said switch network further comprises a fourth switch, said fourth switch coupled between said output terminal and said second input lead, said fourth switch operative to couple said output terminal to said second input lead at the beginning of said second time period and operative to be nonconductive at the beginning of said first and third time periods.

7. The circuit recited in claim 6, wherein said second switch is operative to couple said output terminal to said source of ground potential during said first time period.

8. A method for increasing the slew rate of a buffer circuit driving a load, said buffer circuit having an amplifier and a switch network, said amplifier having an input lead and an output lead, said output lead coupled to an output terminal, said output terminal coupled to said load, said method comprising:

receiving an input signal at said input lead, said input signal having a first time period, a second time period, and a third time period, said first, second and third time periods being contiguous;

isolating said output lead from said load at the beginning of said first time period;

coupling said output lead to said load at the beginning of said second time period; and isolating said output lead from said load and coupling said output terminal to a source of ground potential at the beginning of said third time period.

9. The method recited in claim 8, further comprising coupling said output terminal to a source of ground potential during said first time period.

10. A circuit for driving a load, said circuit comprising:

means for receiving an input signal, said input signal having a first time period, a second time period, and a third time period, said first, second and third time periods being contiguous;

an amplifier having a first input lead, a second input lead and an output lead, said first input lead coupled to said means for receiving, said amplifier developing an output signal corresponding to said input signal for driving said load;

an output terminal coupled to said output lead and said load;

means, coupled between said output lead and said output terminal, for isolating said amplifier from said load at the beginning of said first time period, coupling said amplifier to said load at the beginning of said second time period, and isolating said amplifier from said load at the beginning of said third time period; and means, coupled between said output terminal and a source of ground potential, for coupling said output terminal to said source of ground potential at the beginning of said third time period.

11. The circuit recited in claim 10, wherein said means coupling said output terminal to said source of ground potential at the beginning of said third time period further couples said output terminal to said source of ground potential during said first time period.

12. The circuit recited in claim 11, further comprising means for coupling said output lead to said second input lead at the beginning of said first and third time periods and isolating said output lead from said second input lead at the beginning of said second time period.

13. The circuit recited in claim 12, further comprising means for coupling said output terminal to said second input lead at the beginning of said second time period and isolating said output terminal from said second input lead at the beginning of said first and third time periods.

14. The circuit recited in claim 13, further comprising means for reducing an output voltage error by coupling said output terminal to said second input terminal during said second time period, thereby providing feedback.

* * * * *